(12) United States Patent
Griswold et al.

(10) Patent No.: US 8,368,398 B2
(45) Date of Patent: Feb. 5, 2013

(54) CALIBRATING PARALLEL MRI WITH CARTESIAN CONTINUOUS SAMPLING

(76) Inventors: Mark A. Griswold, Shaker Heights, OH (US); Martin Blaimer, Würzburg (DE); Candice A. Bookwalter, University Heights, OH (US); Kestutis Barkauskas, Cleveland, OH (US)

( * ) Notice: Subject to any disclaimer, the term of this patent is extended or adjusted under 35 U.S.C. 154(b) by 413 days.

(21) Appl. No.: 12/685,696

(22) Filed: Jan. 12, 2010

(65) Prior Publication Data

US 2010/0201363 A1 Aug. 12, 2010

Related U.S. Application Data

(63) Continuation-in-part of application No. 12/150,789, filed on May 1, 2008, now Pat. No. 7,671,589.

(60) Provisional application No. 60/927,224, filed on May 2, 2007.

(51) Int. Cl.
*G01V 3/00* (2006.01)
(52) U.S. Cl. ........................ 324/309; 324/307
(58) Field of Classification Search .......... 324/300–322; 600/407–435
See application file for complete search history.

(56) References Cited

U.S. PATENT DOCUMENTS

| | | | | |
|---|---|---|---|---|
| 7,202,663 | B2 * | 4/2007 | Huang | 324/307 |
| 7,671,589 | B2 * | 3/2010 | Griswold et al. | 324/307 |
| 7,777,487 | B2 * | 8/2010 | Ying et al. | 324/309 |
| 7,945,305 | B2 * | 5/2011 | Aggarwal et al. | 600/413 |
| 8,184,879 | B2 * | 5/2012 | Geier et al. | 382/128 |
| 2010/0034447 | A1 * | 2/2010 | Geier et al. | 382/131 |
| 2010/0237865 | A1 * | 9/2010 | Stemmer | 324/309 |
| 2011/0148410 | A1 * | 6/2011 | Zaitsev et al. | 324/309 |

* cited by examiner

*Primary Examiner* — Brij Shrivastav

(57) ABSTRACT

Example systems, methods, and apparatus control a pMRI apparatus to produce a pulse sequence having an extended acquisition window, and overlapping phase-encoding gradients and read gradients. One example method controls a pMRI apparatus to produce a trajectory having Cartesian and non-Cartesian segments that sample in a manner that satisfies the Nyquist criterion in at least one region of a volume to be imaged. The pMRI apparatus is controlled to apply radio frequency energy to the volume according to the pulse sequence and following the trajectory and to acquire MR signal from the volume in response to the application of the RF energy. The MR signal includes a first component associated with the Cartesian segment of the trajectory and a second component associated with the non-Cartesian segment of the trajectory. The example method includes calibrating a reconstruction process using Nyquist-satisfying data from the second component.

20 Claims, 9 Drawing Sheets

CALIBRATING PARALLEL MRI WITH CARTESIAN CONTINUOUS SAMPLING

CROSS REFERENCE TO RELATED APPLICATIONS

This application claims the benefit of U.S. Utility application Ser. No. 12/150,789, filed May 1, 2008, which claims the benefit of Provisional Patent 60/927,224, filed May 2, 2007, by the same inventors.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Parallel Magnetic Resonance Imaging (pMRI) apparatus acquire signals in parallel using an array of detectors (e.g., coils). The detectors may be arranged in a phased array of coils. Individual coils in the phased array are generally designed to have localized sensitivity, or the sensitivities of coils may be designed to be smooth over a field of view (FOV) and may overlap. Reconstruction in pMRI depends on understanding the actual sensitivity of these coils in a pMRI apparatus during an MRI session. For example, some arrays may have 2, 4, 8, 16, 32, or more coils, some of which may have slight individualities, both as manufactured and as deployed. Additional individualities may appear during an imaging session based on the unknown position of the detectors (e.g. in a flexible array) or due to actual dynamic conditions during image acquisition (e.g., motion, noise, variable coil loading). Thus, actual results may differ from those predicted theoretically. Understanding the actual sensitivity of coils may depend, at least in part, on a per-session calibration of the coils.

pMRI techniques that under sample k-space have been developed. These techniques typically acquire additional coil sensitivity information to offset the effect of the under sampling. The additional coil sensitivity information has conventionally been computed from additional k-space lines acquired specifically for calibration. These lines may be referred to as auto-calibration signal (ACS) lines. Conventionally, a small number of ACS lines are acquired before and/or during a scan to help estimate sensitivities. Thus, at least part of the benefit of under sampling is lost due to the additional time required to acquire ACS lines. Under sampling may lead to a reduction in scan time that is referred to as a reduction factor (R). In some conventional systems, (R−1) extra ACS lines are acquired from near the center of k-space at positions like $m\Delta k_y$, where m counts from 1 to (R−1). With the calibration data available, a reconstruction that includes calculating missing k-space data is based, at least in part, on coil sensitivities computed from the ACS lines may be undertaken.

GRAPPA (Generalized Autocalibrating Partially Parallel Acquisitions) is one technique that reconstructs in k-space by calculating missing k-space data based, at least in part, on information acquired from ACS lines. In GRAPPA, the additionally acquired ACS lines $S_k^{ACS}$ are used to automatically derive a set of linear weights $n_k^{(m)}$. In GRAPPA, missing k-space data can be calculated from measured k-space data in light of the sensitivities and weights to form a complete dense k-space, resulting in a full field of view (FOV) after Fourier transformation.

In GRAPPA, the component coil signals $S_k(k)$ are fit to a single component coil ACS signal. This procedure is repeated for the component coils. Thus, it can be seen that GRAPPA uses multiple k-space lines from multiple coils to fit one single coil ACS line. This results in improved accuracy in the fit procedure over, for example, a system determined from external reference data, which could include static maps of coil sensitivity. Central k-space lines may be fit to calculate reconstruction parameters. Since this fitting procedure involves global information, it may be less affected by local inhomogeneities.

BRIEF DESCRIPTION OF DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Figure 1:
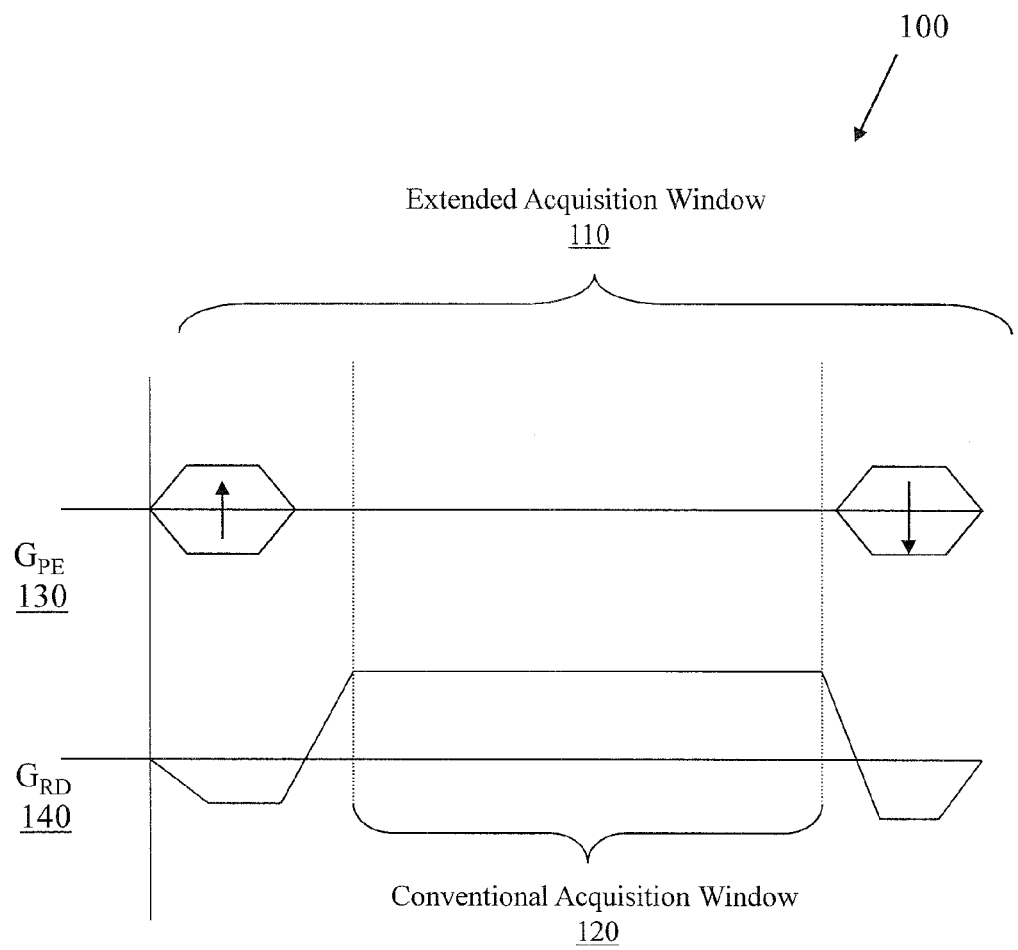
FIG. 1 illustrates a portion of a pulse sequence having an extended acquisition window, and overlapping phase-encoding gradients and read gradients.

Example systems and methods facilitate calibrating a parallel reconstruction process using Cartesian continuous sampling without acquiring ACS lines. In one example, systems and methods may calibrate a GRAPPA reconstruction using both Cartesian continuous sampling and ACS lines. The number of ACS lines may be smaller than in conventional ACS line calibration systems. Recall that the Fourier-domain GRAPPA technique reduces scan time by sampling at a rate less than the Nyquist criterion. In Cartesian pMRI, the under sampling involves skipping phase-encoding steps. Since phase-encoding steps are skipped, less than all the k-space data is acquired. Thus, the "missing" k-space data may need to be computed from available data. While GRAPPA techniques are described, it is to be appreciated that other parallel acquisition techniques may be employed.

Consider an image with a desired resolution of $N_y$ lines in the phase-encoding direction. To achieve a reduction (a.k.a. acceleration) factor (R) of 2, only $N_y/2$ k-space lines may be acquired. Missing k-space data points in a single channel of a detector array can be reconstructed using a linear combination of acquired data points from all channels. However, for an accurate reconstruction, in vivo coil sensitivity calibrations are required. These in vivo coil sensitivity calibrations have typically relied on ACS lines. Conventionally, an additional number ($N_{acs}$) of ACS lines that satisfy the Nyquist criterion are acquired. Thus, ($N_y/R+N_{acs}$) k-space lines are conventionally acquired, where $N_{acs}$ is typically in the range of 16 to 32, with the actual number depending on the number of channels and the desired reduction factor.

Example systems and methods do not require the $N_{acs}$ additional k-space lines, instead relying on data acquired using a Cartesian continuous sampling sequence having an extended acquisition window. The Cartesian continuous sampling sequence acquires data during imaging gradients. Thus, rather than acquiring additional ACS lines, example systems and methods may continuously sample in k-space. While "continuous" sampling is described, one skilled in the art will appreciate that "substantially continuous" sampling may occur. Additionally, periodic sampling during gradient changing may be employed and may be considered to be "continuous sampling" as used herein. Conventional systems do not sample as gradients are changed to move between k-space lines. For example, conventional systems do not sample as gradients are changed to move to outer k-space lines. The example systems and methods here may continue to sample during these periods. This sampling uses rather than wastes the time spent changing the gradient to move to the outer k-space lines thereby amortizing the cost of moving between k-space lines. Additionally, example systems and methods may acquire one or more ACS lines to facilitate blended calibration.

Changing a gradient is not instantaneous. Additionally, the speed at which a trajectory moves is related to the gradient strength. So, rather than simply sit idle and not sample while a gradient is being changed, example systems and methods may continue to sample during the motion. In this way, a system that is going to spend the time to do a traversal to an outer k-space line will sample and acquire data that can be employed for calibration. Thus, the continuous sampling removes the need to acquire additional ACS lines, or reduces the number of required ACS lines, which in turn reduces the overall time required for an imaging session. While the need to acquire ACS lines is removed or reduced, some example systems and methods may still acquire an ACS line(s).

Figure 2:
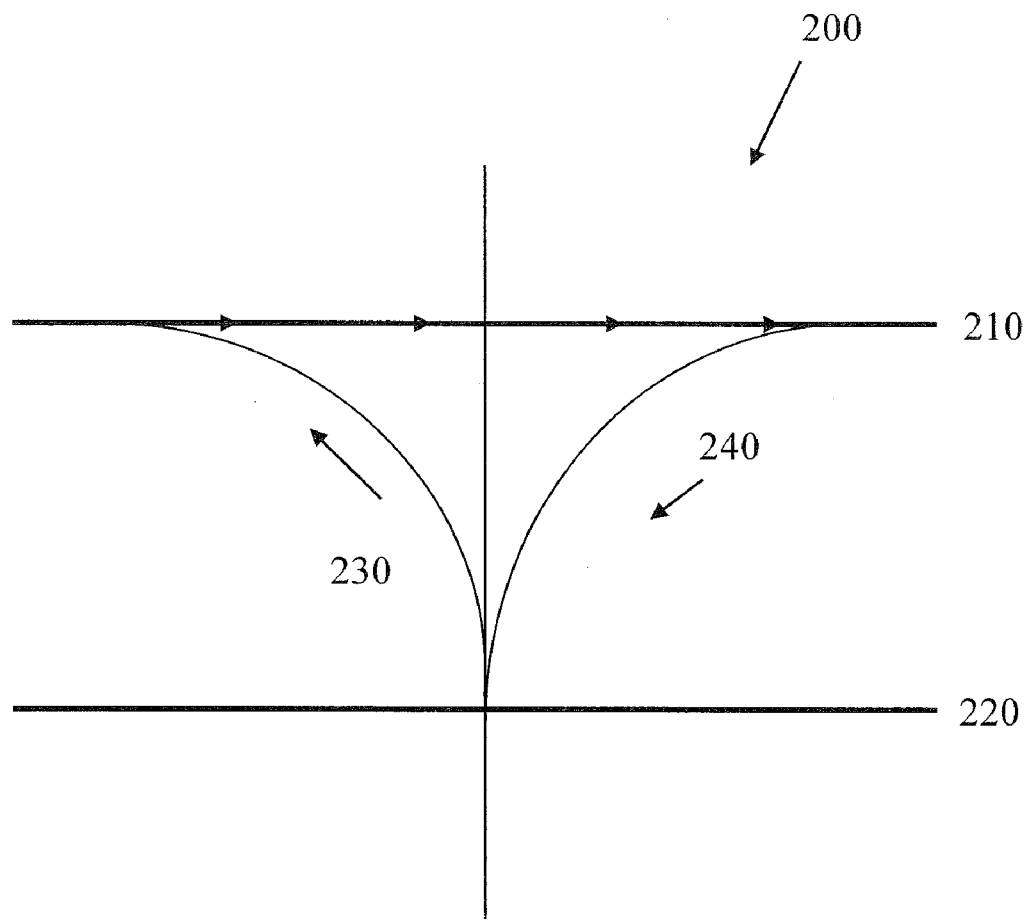
FIG. 2 illustrates a portion of a hybrid k-space trajectory that includes both Cartesian and non-Cartesian segments.

FIG. 1 illustrates a portion 100 of a pulse sequence having an extended acquisition window 110, and an overlapping phase-encoding gradient 130 and read gradient 140. The overlapping phase-encoding gradients 130 and read gradients 140 yield a trajectory having both Cartesian and non-Cartesian segments. FIG. 2 illustrates a trajectory 200 having both Cartesian segments (e.g., segment 210, segment 220) and non-Cartesian segments (e.g., segment 230, segment 240). Returning now to FIG. 1, note the extended acquisition window 110 as compared to a conventional acquisition window 120. Extending the acquisition window facilitates acquiring additional data that can be used for calibration. The non-Cartesian portion of the resulting trajectory coupled with additional sampling causes central k-space to be over-sampled with respect to the desired under sampling. The non-Cartesian portions (e.g., 230, 240) represent the time during which a traversal is being made from one k-space line (e.g., 220) to another k-space line (e.g., 210). While the extended acquisition window 110 is illustrated encompassing all of the portion 100 of the pulse sequence, it is to be appreciated that the extended acquisition window may cover less than all of portion 100.

In one example, the non-Cartesian portion of the resulting trajectory leads to central k-space being sampled in a manner that satisfies the Nyquist criterion. Thus, this critically and over-sampled data may be used to calibrate a reconstruction process. In one example the reconstruction process may be a GRAPPA reconstruction process. After the calibration is performed, data in an under-sampled Cartesian area can be reconstructed based, at least in part, on the data acquired in the region that satisfies the Nyquist criterion and the calibration data.

FIG. 2 illustrates a k-space trajectory 200. The trajectory 200 includes two Cartesian segments (e.g., segment 210, segment 220) and two non-Cartesian segments (e.g., segment 230, segment 240). Conventionally, sampling would only occur on lines 210 and 220. Example systems and methods also sample along segment 230 and segment 240 of the trajectory. In one example, sampling will be continuous and/or substantially continuous along the length of both segment 230 and segment 240. In another example, sampling may occur for only a portion of segment 230 and a portion of segment 240. In yet another example, sampling may be continuous, periodic, and/or substantially continuous along either segment 230 or segment 240 or may occur for only a portion of segment 230 or segment 240. The additional data acquired by sampling along segment 230 and/or segment 240 can be used to calibrate a reconstruction. This additional sampling may be referred to as continuous Cartesian sampling, even though the sampling may be less than "continuous".

Figure 3:
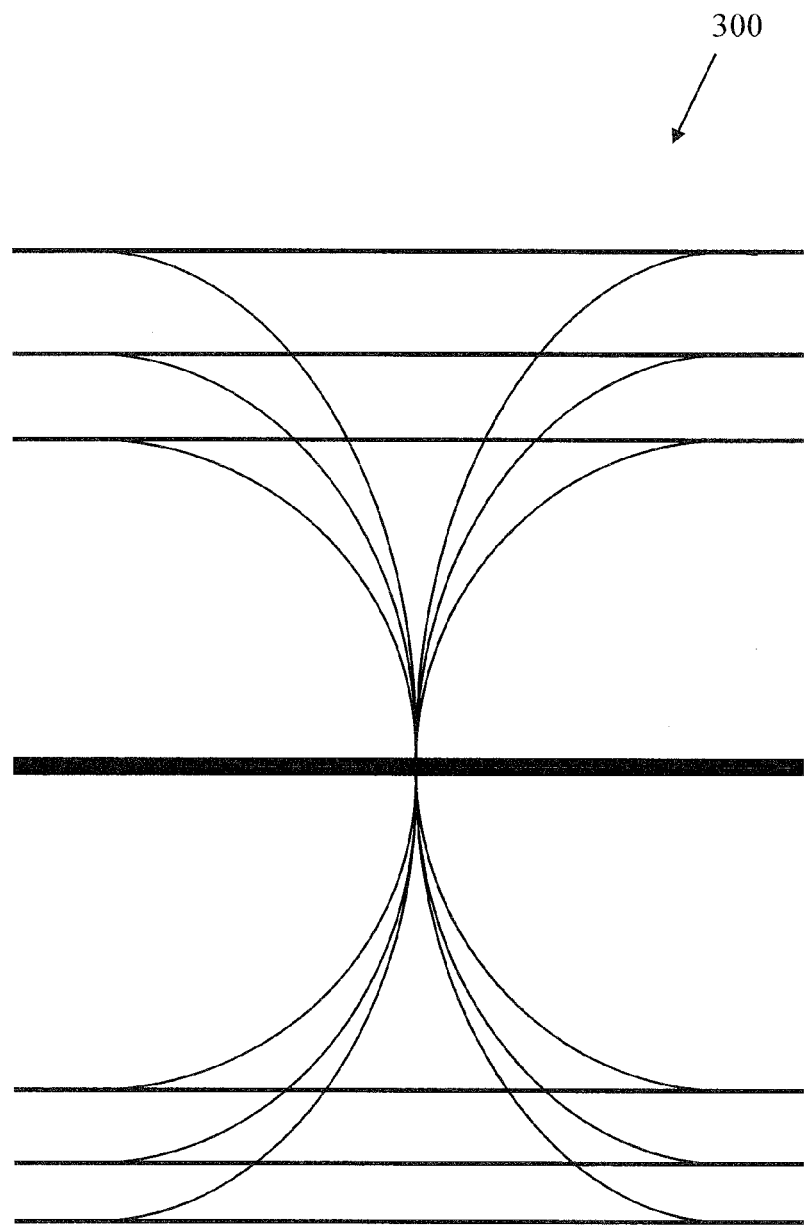
FIG. 3 illustrates a portion of an acquisition resulting from a hybrid k-space trajectory and a pulse sequence having an extended acquisition window, and overlapping phase-encoding gradients and read gradients.

FIG. 3 illustrates an acquisition 300 of data from k-space that is built up from a set of trajectory portions like that illustrated in FIG. 2. The acquisition 300 can be configured to sample at least a portion of the central k-space area in a manner that satisfies the Nyquist criteria. Thus, while outer regions of acquisition 300 may be under-sampled, inner regions (e.g., central k-space) may not be under-sampled.

Indeed, central k-space may be critically sampled and may, therefore, include sufficient information for calibrating a reconstruction. While FIG. 3 illustrates an acquisition 300 where sampling occurs along every transition between Cartesian lines, example systems and methods may not acquire along every transition.

Figure 4:
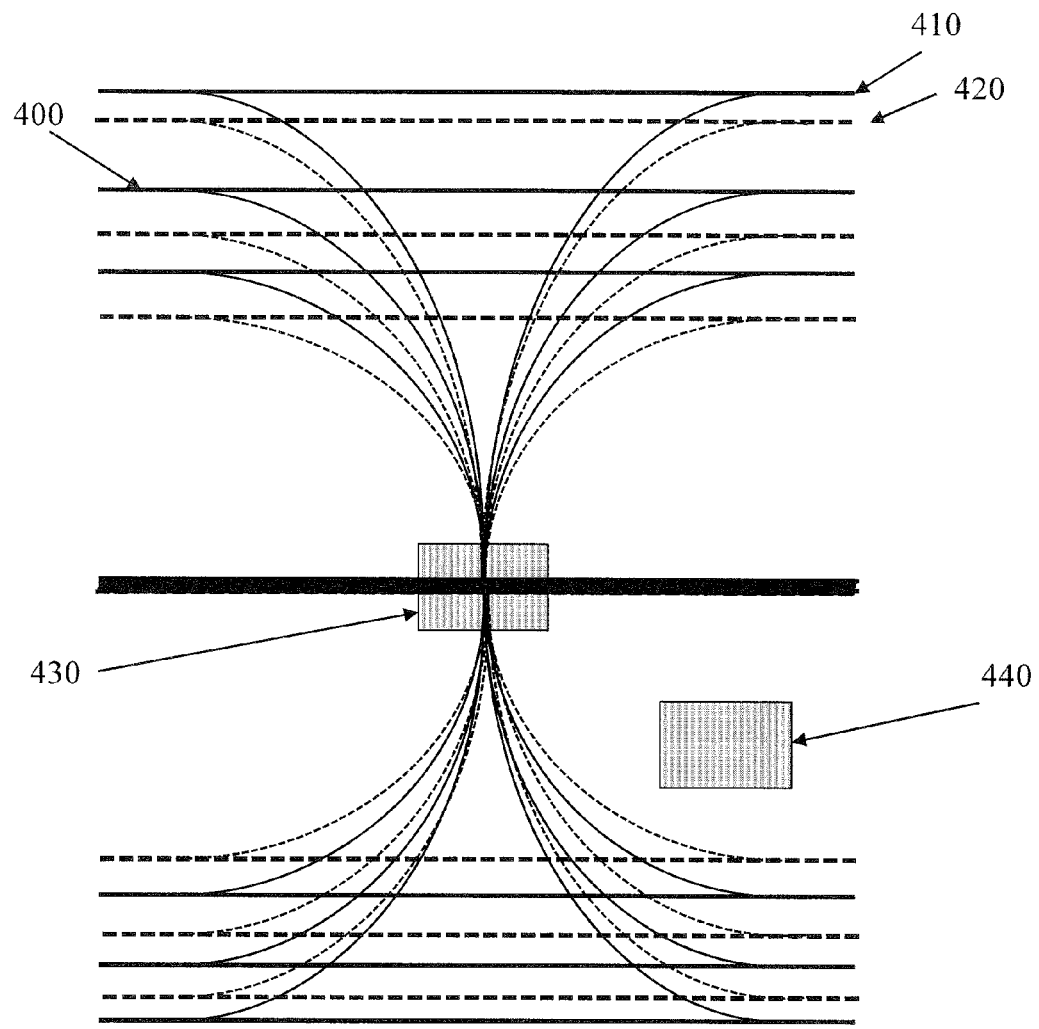
FIG. 4 illustrates sampling regions associated with data associated with a parallel reconstruction scheme performed on data acquired using a hybrid k-space trajectory and a pulse sequence having an extended acquisition window, and overlapping phase-encoding gradients and read gradients.

FIG. 4 illustrates an acquisition 400 of data from k-space that is built up from a set of trajectory segments like that illustrated in FIG. 2. The acquisition 400 illustrates a trajectory 410 along which data was acquired and a trajectory 420 along which data was not acquired. A fully sampled acquisition may have included acquiring data along both trajectory 410 and trajectory 420. Thus, some data may be missing from k-space. However, acquisition 400 illustrations a region 430 that is sampled in a manner that satisfies the Nyquist criteria. Therefore, data sampled from the region 430 during the non-Cartesian segment of the acquisition that satisfies the Nyquist criteria may be used to calibrate the reconstruction process. This data may have been acquired using the continuous sampling described in connection with trajectory 200 (FIG. 2) and pulse sequence 100 (FIG. 1). Missing data points in the Cartesian portion of the acquisition (e.g., points in region 440) can be reconstructed based, at least in part, on the additional data. Note that no additional ACS lines were acquired.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

ASIC: application specific integrated circuit.
CD: compact disk.
CD-R: CD recordable.
CD-RW: CD rewriteable.
DVD: digital versatile disk and/or digital video disk.
HTTP: hypertext transfer protocol.
LAN: local area network.
PCI: peripheral component interconnect.
PCIE: PCI express.
RAM: random access memory.
DRAM: dynamic RAM.
SRAM: synchronous RAM.
ROM: read only memory.
PROM: programmable ROM.
USB: universal serial bus.
WAN: wide area network.

"Computer component", as used herein, refers to a computer-related entity (e.g., hardware, firmware, software in execution, combinations thereof). Computer components may include, for example, a process running on a processor, a processor, an object, an executable, a thread of execution, and a computer. A computer component(s) may reside within a process and/or thread. A computer component may be localized on one computer and/or may be distributed between multiple computers.

"Computer communication", as used herein, refers to a communication between computing devices (e.g., computer, personal digital assistant, cellular telephone) and can be, for example, a network transfer, a file transfer, an applet transfer, an email, an HTTP transfer, and so on. A computer communication can occur across, for example, a wireless system (e.g., IEEE 802.11), an Ethernet system (e.g., IEEE 802.3), a token ring system (e.g., IEEE 802.5), a LAN, a WAN, a point-to-point system, a circuit switching system, a packet switching system, and so on.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and so on. Volatile media may include, for example, semiconductor memories, dynamic memory, and so on. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Data store", as used herein, refers to a physical and/or logical entity that can store data. A data store may be, for example, a database, a table, a file, a list, a queue, a heap, a memory, a register, and so on. In different examples, a data store may reside in one logical and/or physical entity and/or may be distributed between two or more logical and/or physical entities.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and so on. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

An "operable connection", or a connection by which entities are "operably connected", is one in which signals, physical communications, and/or logical communications may be sent and/or received. An operable connection may include a physical interface, an electrical interface, and/or a data interface. An operable connection may include differing combinations of interfaces and/or connections sufficient to allow operable control. For example, two entities can be operably connected to communicate signals to each other directly or through one or more intermediate entities (e.g., processor, operating system, logic, software). Logical and/or physical communication channels can be used to create an operable connection.

"Signal", as used herein, includes but is not limited to, electrical signals, optical signals, analog signals, digital signals, data, computer instructions, processor instructions, messages, a bit, a bit stream, or other means that can be received, transmitted and/or detected.

"Software", as used herein, includes but is not limited to, one or more executable instruction that cause a computer, processor, or other electronic device to perform functions, actions and/or behave in a desired manner. "Software" does not refer to stored instructions being claimed as stored instructions per se (e.g., a program listing). The instructions may be embodied in various forms including routines, algorithms, modules, methods, threads, and/or programs including separate applications or code from dynamically linked libraries.

"User", as used herein, includes but is not limited to one or more persons, software, computers or other devices, or combinations of these.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic, and so on. The physical manipulations create a concrete, tangible, useful, real-world result.

It has proven convenient at times, principally for reasons of common usage, to refer to these signals as bits, values, elements, symbols, characters, terms, numbers, and so on. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and so on, refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 5:
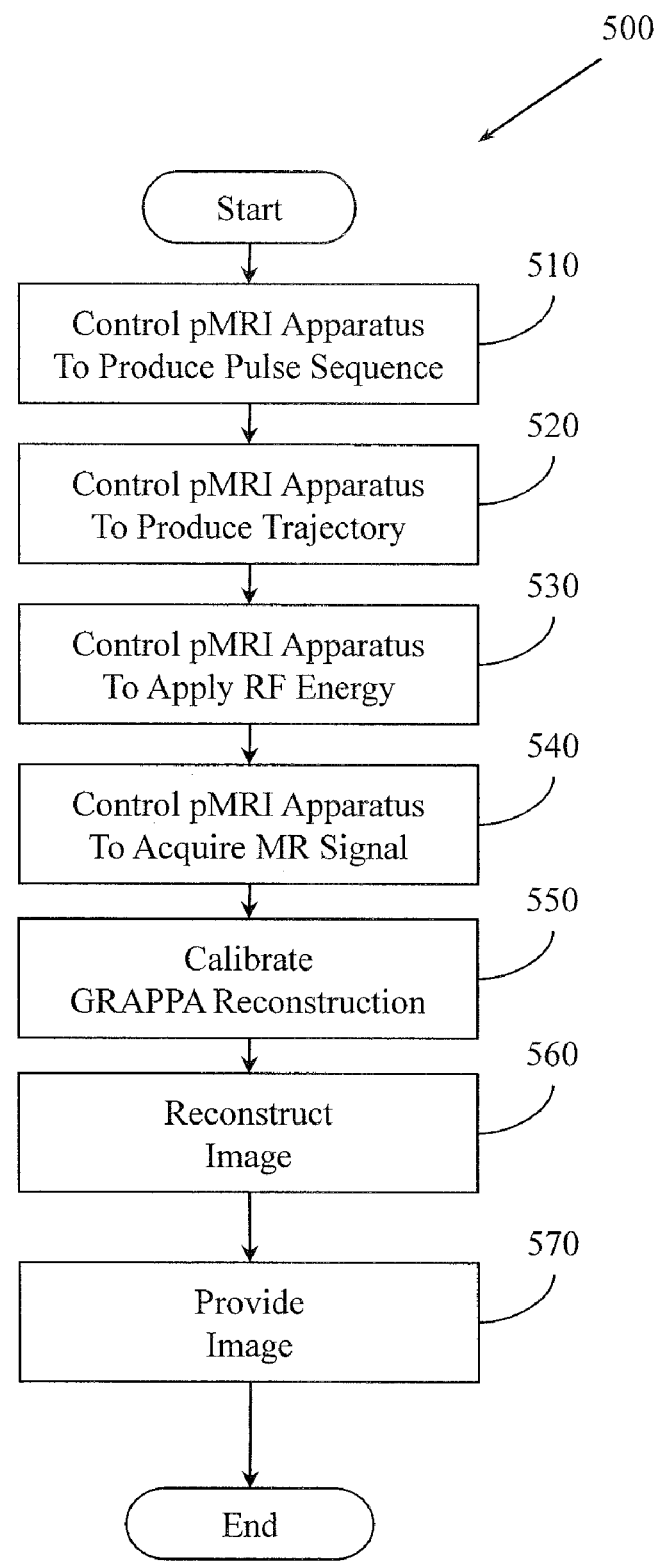
FIG. 5 illustrates a method for performing parallel acquisition reconstruction that includes calibration based on data acquired in response to a k-space trajectory having both Cartesian and non-Cartesian segments and a pulse sequence having an extended acquisition window, and overlapping phase-encoding and read gradients.

FIG. 5 illustrates a method 500 for calibrating a parallel reconstruction without acquiring additional ACS lines. Method 500 includes, at 510, controlling a pMRI apparatus to produce a pulse sequence. The pulse sequence is to have an extended acquisition window. The pulse sequence is also to have overlapping phase-encoding gradients and read gradients. A portion of an example pulse sequence is illustrated in FIG. 1.

Method 500 also includes, at 520, controlling the pMRI apparatus to produce a trajectory having both Cartesian and non-Cartesian segments. One skilled in the art will appreciate that the pulse sequence produced at 510 may yield the trajectory having both Cartesian and non-Cartesian segments. Thus, in one example, method 500 may combine actions 510 and 520 into a single action. An example trajectory is illustrated in FIG. 2. Using the pulse sequence and the trajectory, a central k-space region may be critically-sampled while a Cartesian segment may be under sampled. This may facilitate reducing acquisition time while still acquiring information for calibrating a reconstruction process.

Method 500 also includes, at 530, controlling the pMRI apparatus to apply radio frequency (RF) energy to a volume to be imaged. The RF energy is to be applied according to the pulse sequence and following the hybrid trajectory.

Method 500 also includes, at 540, controlling the pMRI apparatus to acquire MR signal from the volume in response to the application of the RF energy. The acquired MR signal will include a first component that is associated with the Cartesian segment of the trajectory. The acquired MR signal will also include a second component associated with the non-Cartesian segment of the trajectory. The MR signal will satisfy the Nyquist criteria in at least one region of the volume. In one example, the at least one region is a central region in k-space.

Acquiring the MR signal may include controlling the pMRI apparatus to sample at different times during the non-Cartesian segment of the trajectory. For example, the pMRI apparatus may be controlled to continuously sample during the non-Cartesian segment of the trajectory, to sample during at least a portion of the non-Cartesian segment of the trajectory, and to not sample during at least a portion of the non-Cartesian segment of the trajectory.

Method 500 also includes, at 550, calibrating a reconstruction process. The reconstruction process will be calibrated using Nyquist-satisfying data from the second component of the MR signal. Recall that the Nyquist-satisfying data is acquired from at least one region (e.g., central k-space region) in the volume to be imaged.

Method 500 also includes, at 560, reconstructing an image from the MR signal using the calibrated reconstruction process and, at 570, providing the image reconstructed at 560. The image may be provided to a display on which the image will be displayed. The image may also be provided to a memory where the image will be stored.

Figure 6:
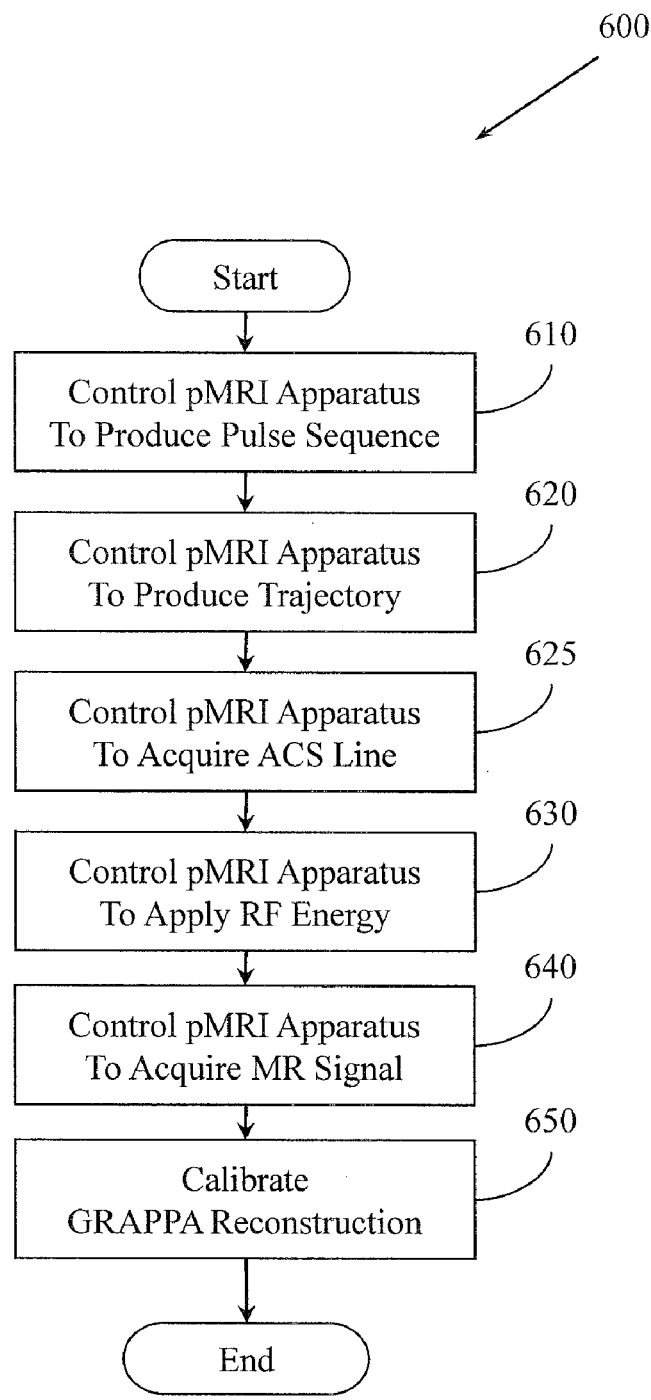
FIG. 6 illustrates a method for performing parallel acquisition reconstruction that includes calibration based on data acquired in response to a k-space trajectory having both Cartesian and non-Cartesian segments and a pulse sequence having an extended acquisition window, and overlapping phase-encoding and read gradients.

FIG. 6 illustrates a method 600 for calibrating a parallel reconstruction (e.g., GRAPPA reconstruction) using both data acquired during Cartesian continuous sampling and additional ACS lines. Method 600 includes several actions similar to those described in connection with method 500 (FIG. 5). For example, method 600 includes controlling a pMRI apparatus to produce a pulse sequence at 610, controlling the pMRI apparatus to produce a trajectory at 620, controlling the pMRI apparatus to apply RF energy at 630, controlling the pMRI apparatus to acquire MR signal at 640, and calibrating a reconstruction at 650. However, method 600 may include an additional action.

For example, method 600 includes, at 625, controlling the pMRI apparatus to acquire at least one auto-calibration signal (ACS) line. While "at least one" ACS line is described, it is to be appreciated that in different examples method 600 may include controlling the pMRI apparatus to acquire less than a complete set of ACS lines, to acquire a complete set of ACS lines, and so on. Since an ACS line is acquired by method 600, the calibrating at 650 may be based on both Nyquist-satisfying data from the second component and an ACS line(s).

Figure 7:
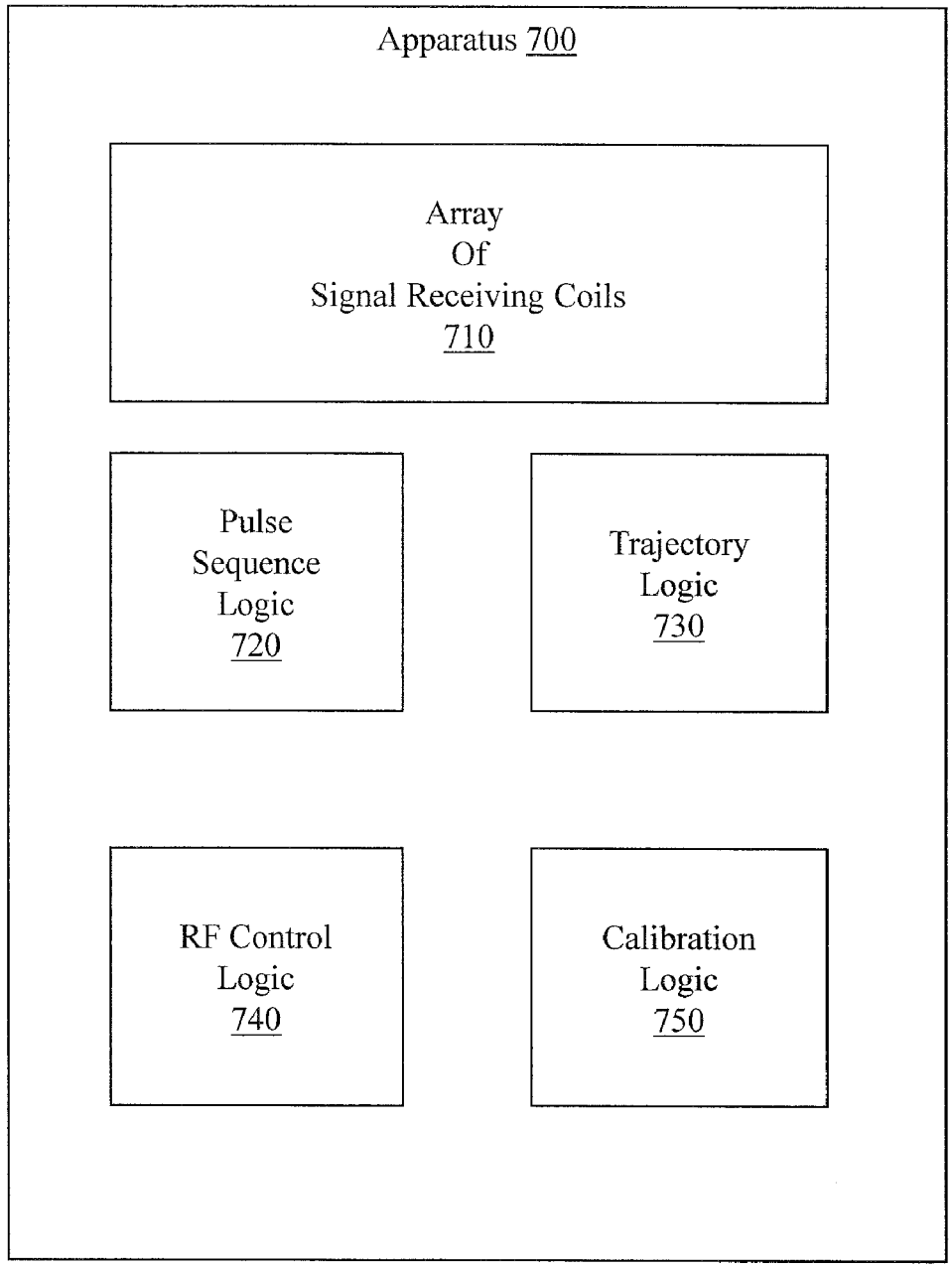
FIG. 7 illustrates a pMRI apparatus configured to perform parallel acquisition reconstruction that includes calibration based on data acquired in response to a k-space trajectory having both Cartesian and non-Cartesian segments and a pulse sequence having an extended acquisition window, and overlapping phase-encoding and read gradients.

FIG. 7 illustrates an apparatus 700 associated with Cartesian continuous sampling. In one example, apparatus 700 may be incorporated into a pMRI apparatus. In another example, apparatus 700 may be external to but operably connected to a pMRI apparatus. Apparatus 700 includes an array 710 of signal receiving coils to receive MR signal from a volume to be imaged. The array 710 may be, for example, a phased array of receiving coils.

Apparatus 700 also includes a pulse sequence logic 720. The pulse sequence logic 720 controls a pMRI apparatus to produce a pulse sequence having an extended acquisition window. The pulse sequence is also to have overlapping phase-encoding gradients and read gradients. A portion of an example pulse sequence is illustrated in FIG. 1.

Apparatus 700 also includes a trajectory logic 730. The trajectory logic 730 is to control the pMRI apparatus to produce a trajectory having both Cartesian and non-Cartesian segments. While a trajectory logic 730 is illustrated, it is to be appreciated that the trajectory may be produced as a result of the pulse sequence produced by the pulse sequence logic 720. Thus, in one example, apparatus may not include a separate trajectory logic 730. An example trajectory is illustrated in FIG. 2. Conventionally, MR signal would be acquired during the Cartesian portion of the trajectory and would not be acquired during the non-Cartesian portion of the trajectory while a gradient is being changed. Example systems and methods acquire signal during at least a portion of the non-Cartesian segment to acquire information from which a reconstruction process can be calibrated.

Apparatus 700 also includes a RF control logic 740. The RF control logic 740 is to control the pMRI apparatus to apply RF energy to a volume to be imaged. The RF energy is to be applied to the volume according to the pulse sequence and following the trajectory. The RF control logic 740 may also control the pMRI apparatus to acquire MR signal from the volume in response to the application of the RF energy. The acquired MR signal will include a first component associated with the Cartesian segment of the trajectory. The MR signal will also include a second component that is associated with the non-Cartesian segment of the trajectory. The pulse sequence and trajectory are to produce an MR signal that satisfies the Nyquist criteria in at least one region of the value. The at least one region may be, for example, a central k-space region. Regions outside the at least one region may be under sampled while the at least one region may be critically sampled.

In different examples, the RF control logic 740 may control the pMRI apparatus to acquire MR signals during different portions of the non-Cartesian segment of the trajectory. In one example, the RF control logic 740 controls the pMRI apparatus to continuously sample during the non-Cartesian segment of the trajectory while in another example, the RF control logic 740 controls the pMRI apparatus to continuously sample during at least a portion of the non-Cartesian segment of the trajectory. In one example, the RF control logic 740 may even control the pMRI apparatus to not sample during at least a portion of the non-Cartesian segment of the trajectory.

In one example, the RF control logic 740 controls the pMRI apparatus to acquire at least one auto-calibration signal line. In this example, the calibration logic 750 calibrates the reconstruction process using Nyquist-satisfying data from the second component of the MR signal and the at least one auto-calibration signal line.

Apparatus 700 also includes a calibration logic 750. The calibration logic 750 calibrates a reconstruction process using Nyquist-satisfying data from the second component of the MR signal. Note that Nyquist-satisfying data is acquired from the at least one region (e.g., central k-space region).

In one example, apparatus 700 may also include a reconstruction logic to reconstruct an image from the MR signal. The reconstruction logic will rely on the calibration performed by the calibration logic 750. The apparatus 700 may also include a display to display the image and/or a memory to store the image.

Figure 8:
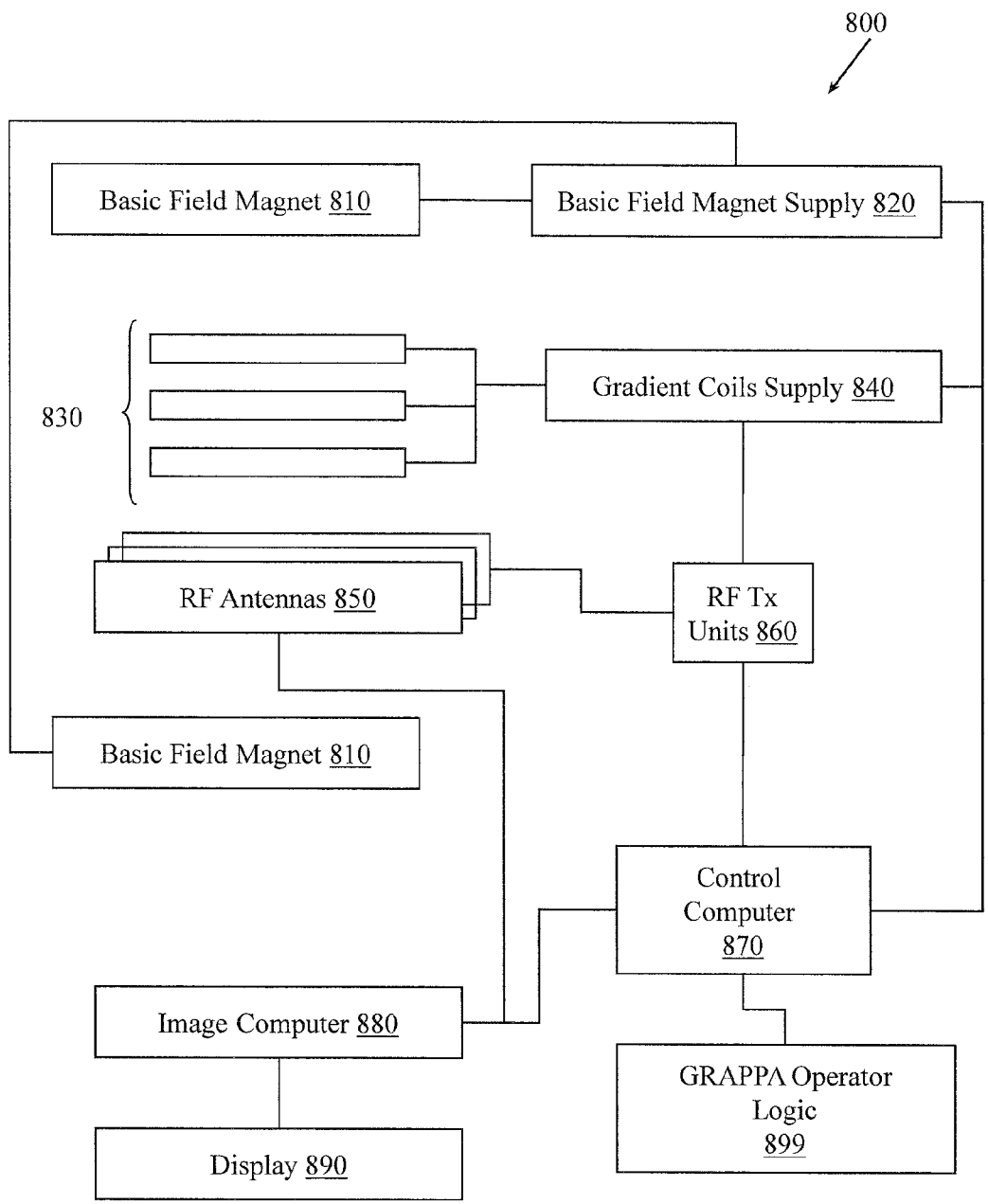
FIG. 8 illustrates a pMRI apparatus configured to perform parallel acquisition reconstruction that includes calibration based on data acquired in response to a k-space trajectory having both Cartesian and non-Cartesian segments and a pulse sequence having an extended acquisition window, and overlapping phase-encoding and read gradients.

FIG. 8 illustrates an MRI apparatus 800 configured with a Cartesian continuous sampling logic 899. Logic 899 facilitates calibrating a reconstruction using data acquired during Cartesian continuous sampling as described above. The Cartesian continuous sampling logic 899 may be configured with elements of example apparatus described herein and/or may perform example methods described herein.

The apparatus 800 includes a basic field magnet(s) 810 and a basic field magnet supply 820. Ideally, the basic field magnets 810 would produce a uniform $B_0$ field. However, in practice, the $B_0$ field may not be uniform, and may vary over an object being imaged by the MRI apparatus 800. MRI apparatus 800 may include gradient coils 830 configured to emit gradient magnetic fields like $G_S$, $G_P$ and $G_R$. The gradient coils 830 may be controlled, at least in part, by a gradient coils supply 840. In some examples, the timing, strength, and orientation of the gradient magnetic fields may be controlled, and thus selectively adapted during an MRI procedure.

MRI apparatus 800 may include a set of RF antennas 850 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 850 may be controlled, at least in part, by a set of RF transmission units 860. An RF transmission unit 860 may provide a signal to an RF antenna 850.

The gradient coils supply 840 and the RF transmission units 860 may be controlled, at least in part, by a control computer 870. In one example, the control computer 870 may be programmed to control a pMRI device as described herein. The magnetic resonance signals received from the RF antennas 850 can be employed to generate an image and thus may be subject to a transformation process like a two dimensional fast Fourier Transform (FFT) that generates pixilated image data. The transformation can be performed by an image computer 880 or other similar processing device. The image data may then be shown on a display 890. While FIG. 8 illustrates an example MRI apparatus 800 that includes various components connected in various ways, it is to be appreciated that other MRI apparatus may include other components connected in other ways.

Figure 9:
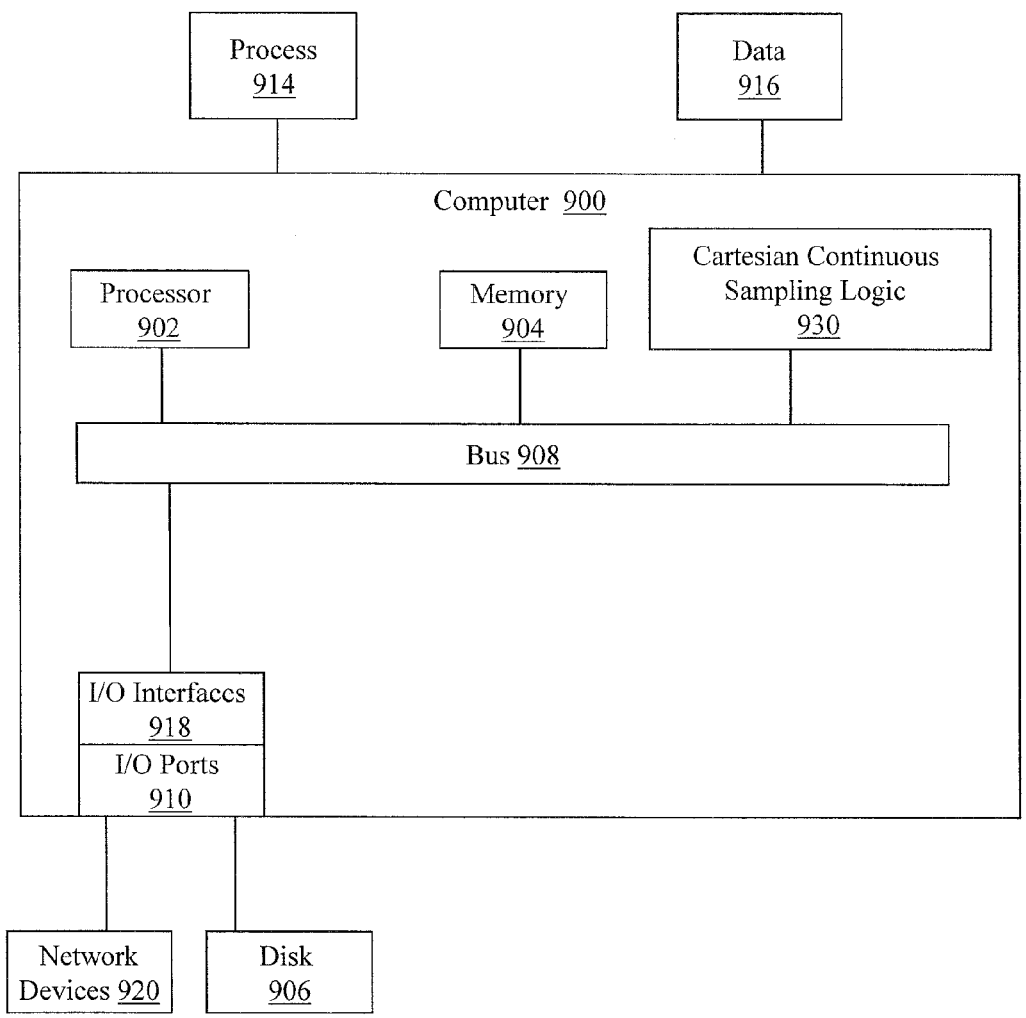
FIG. 9 illustrates a computing device in which example methods described herein may be performed to control image reconstruction that includes calibration based on data acquired in response to a k-space trajectory having both Cartesian and non-Cartesian segments and a pulse sequence having an extended acquisition window, and overlapping phase-encoding and read gradients.

FIG. 9 illustrates an example computing device in which example methods described herein, and equivalents, may operate. The example computing device may be a computer 900 that includes a processor 902, a memory 904, and input/output ports 910 operably connected by a bus 908. In one example, the computer 900 may include a Cartesian continuous sampling logic 930 to facilitate controlling image reconstruction based, at least in part, on data acquired during gradient transitions. In different examples, the logic 930 may be implemented in hardware, software, firmware, and/or combinations thereof. While the logic 930 is illustrated as a hardware component attached to the bus 908, it is to be appreciated that in one example, the logic 930 may be implemented in the processor 902.

Thus, logic 930 may provide means (e.g., hardware, software, firmware) for generating a pulse sequence having an extended acquisition window. The pulse sequence also may have overlapping phase-encoding gradients and read gradients that produce a trajectory having both Cartesian segments and non-Cartesian segments. The means may be implemented, for example, as an ASIC programmed to control an image reconstruction computer. The means may also be implemented as computer executable instructions that are presented to computer 900 as data 916 that are temporarily stored in memory 904 and then executed by processor 902. Logic 930 may also provide means (e.g., hardware, software, firmware) for receiving data from a continuous Cartesian sampling produced in response to the pulse sequence. Logic 930 may also provide means (e.g., hardware, software, firmware) for calibrating a reconstruction. The calibration may be based, at least in part, on calibration data that satisfies the Nyquist criteria, where the calibration data is acquired from continuous Cartesian sampling produced in response to the pulse sequence that has both Cartesian and non-Cartesian segments.

Generally describing an example configuration of the computer 900, the processor 902 may be a variety of various processors including dual microprocessor and other multiprocessor architectures. A memory 904 may include volatile memory and/or non-volatile memory. Non-volatile memory may include, for example, ROM, PROM, and so on. Volatile memory may include, for example, RAM, SRAM, DRAM, and so on.

A disk 906 may be operably connected to the computer 900 via, for example, an input/output interface (e.g., card, device) 918 and an input/output port 910. The disk 906 may be, for example, a magnetic disk drive, a solid state disk drive, a floppy disk drive, a tape drive, a Zip drive, a flash memory card, a memory stick, and so on. Furthermore, the disk 906 may be a CD-ROM drive, a CD-R drive, a CD-RW drive, a DVD ROM, and so on. The memory 904 can store a process 914 and/or a data 916, for example. The disk 906 and/or the memory 904 can store an operating system that controls and allocates resources of the computer 900.

The bus 908 may be a single internal bus interconnect architecture and/or other bus or mesh architectures. While a single bus is illustrated, it is to be appreciated that the computer 900 may communicate with various devices, logics, and peripherals using other busses (e.g., PCIE, 1394, USB, Ethernet). The bus 908 can be types including, for example, a memory bus, a memory controller, a peripheral bus, an external bus, a crossbar switch, and/or a local bus.

The computer 900 may interact with input/output devices via the i/o interfaces 918 and the input/output ports 910. Input/output devices may be, for example, a keyboard, a microphone, a pointing and selection device, cameras, video cards, displays, the disk 906, the network devices 920, and so on. The input/output ports 910 may include, for example, serial ports, parallel ports, and USB ports. The computer 900 can operate in a network environment and thus may be connected to the network devices 920 via the i/o interfaces 918, and/or the i/o ports 910. Through the network devices 920, the computer 900 may interact with a network. Through the network, the computer 900 may be logically connected to remote computers. Networks with which the computer 900 may interact include, but are not limited to, a LAN, a WAN, and other networks.

While example systems, methods, and so on have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, and so on described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable medium storing computer executable instructions that when executed by a computer cause the computer to perform a method, the method comprising:
   controlling a parallel magnetic resonance imaging (pMRI) apparatus to produce a pulse sequence having an extended acquisition window, where the pulse sequence has overlapping, phase-encoding gradients and read gradients, and where the pulse sequence controls the pMRI apparatus to produce a trajectory having both Cartesian and non-Cartesian segments;
   controlling the pMRI apparatus to apply radio frequency (RF) energy to a volume to be imaged according to the pulse sequence and following the trajectory;
   controlling the pMRI apparatus to acquire magnetic resonance (MR) signal from the volume in response to the application of the RF energy, where the MR signal includes a first component associated with the Cartesian segment of the trajectory and where the MR signal includes a second component associated with the non-Cartesian segment of the trajectory, and where the MR signal satisfies the Nyquist criteria in at least one region of the volume;
   calibrating a partially parallel acquisition reconstruction process using Nyquist-satisfying data from the second component, where the Nyquist-satisfying data is acquired from the at least one region;
   reconstructing an image from the MR signal using the calibrated reconstruction process; and
   providing the image.

2. The non-transitory computer-readable medium of claim 1, including controlling the pMRI apparatus to continuously sample during the non-Cartesian segment of the trajectory.

3. The non-transitory computer-readable medium of claim 1, including controlling the pMRI apparatus to sample during at least a portion of the non-Cartesian segment of the trajectory.

4. The non-transitory computer-readable medium of claim 3, including controlling the pMRI apparatus to not sample during at least a portion of the non-Cartesian segment of the trajectory.

5. The non-transitory computer-readable medium of claim 1, where the at least one region is a central k-space region.

6. The non-transitory computer-readable medium of claim 5, where the central k-space region is critically-sampled by the trajectory.

7. The non-transitory computer-readable medium of claim 1, where the at least a portion of the Cartesian segment is under sampled in the phase encoding direction.

8. The non-transitory computer-readable medium of claim 1, including controlling the pMRI apparatus to acquire at least one auto-calibration signal line.

9. The non-transitory computer-readable medium of claim 8, including controlling the pMRI apparatus to acquire less than a complete set of auto-calibration signal lines.

10. The non-transitory computer-readable medium of claim 9, where calibrating the reconstruction process includes using Nyquist-satisfying data from the second component and at least one auto-calibration signal line from the less than complete set of auto-calibration signal lines.

11. A parallel MRI (pMRI) apparatus, comprising:
an array of signal receiving coils to receive MR signal from a volume to be imaged;
a pulse sequence logic to control a pMRI apparatus to produce a pulse sequence having an extended acquisition window, where the pulse sequence has overlapping phase-encoding gradients and read gradients, where the pulse sequence controls the pMRI apparatus to produce a trajectory having both Cartesian and non-Cartesian segments;
a radio-frequency control logic to control the pMRI apparatus to apply radio frequency (RF) energy to the volume to be imaged according to the pulse sequence and following the trajectory and to acquire MR signal from the volume in response to the application of the RF energy, where the MR signal includes a first component associated with the Cartesian segment of the trajectory, and where the MR signal includes a second component associated with the non-Cartesian segment of the trajectory, and where the MR signal satisfies the Nyquist criteria in at least one region ; and
a calibration logic to calibrate a reconstruction process using Nyquist-satisfying data from the second component, where the Nyquist-satisfying data is acquired from the at least one region.

12. The pMRI apparatus of claim 11, including a reconstruction logic to reconstruct an image from the MR signal using the calibrated reconstruction process.

13. The pMRI apparatus of claim 12, including a display to display the image.

14. The pMRI apparatus of claim 11, where the RF control logic controls the pMRI apparatus to continuously sample during the non-Cartesian segment of the trajectory.

15. The pMRI apparatus of claim 11, where the RF control logic controls the pMRI apparatus to continuously sample during at least a portion of the non-Cartesian segment of the trajectory.

16. The pMRI apparatus of claim 11, where the RF control logic controls the pMRI apparatus to not sample during at least a portion of the non-Cartesian segment of the trajectory.

17. The pMRI apparatus of claim 11, where the RF control logic controls the pMRI apparatus to critically sample a central k-space region of the volume to be imaged and to under sample a portion of the volume associated with the Cartesian segment of the trajectory.

18. The pMRI apparatus of claim 11, where the RF control logic controls the pMRI apparatus to acquire at least one auto-calibration signal line and where the calibration logic is to calibrate the reconstruction process using Nyquist-satisfying data from the second component and the at least one auto-calibration signal line.

19. A computer that calibrates a parallel reconstruction, comprising:
a processor;
a memory;
a set of logics configured to calibrate a parallel reconstruction; and
an interface connecting the processor, the memory, and the set of logics:
the set of logics comprising:
a first logic that generates a pulse sequence having an extended acquisition window and having overlapping phase-encoding and read gradients that produce a hybrid trajectory having both Cartesian and non-Cartesian segments;
a second logic that receives data from a continuous Cartesian sampling produced in response to the pulse sequence and the hybrid trajectory; and
a third logic that calibrates a parallel reconstruction using data from the continuous Cartesian sampling that satisfies the Nyquist criteria.

20. A method, comprising:
acquiring data from a Cartesian continuous sampling sequence; and
calibrating a parallel magnetic resonance imaging (pMRI) apparatus based on the data acquired from the a Cartesian continuous sampling sequence,
where the Cartesian continuous sampling sequence includes an extended acquisition window having overlapping phase-encoding gradients and read gradients and a hybrid trajectory having both Cartesian and non-Cartesian segments, and
where the non-Cartesian segment samples a portion of k-space at the Nyquist criteria.

* * * * *